United States Patent [19]

Martin

[11] Patent Number: 6,107,829

[45] Date of Patent: Aug. 22, 2000

[54] LOW LEAKAGE TRISTATABLE MOS OUTPUT DRIVER

[75] Inventor: David G. Martin, Bethlehem, Pa.

[73] Assignee: Lucent Technologies, Inc., Murray Hill, N.J.

[21] Appl. No.: 09/052,074

[22] Filed: Mar. 31, 1998

[51] Int. Cl.[7] .......................... H03K 19/00; H03K 19/02; H03K 19/0175; H03K 19/094
[52] U.S. Cl. ................................ 326/58; 326/27; 326/83
[58] Field of Search ................................ 326/58, 57, 56, 326/15, 27, 26, 83, 86, 121

[56] References Cited

U.S. PATENT DOCUMENTS

| | | | |
|---|---|---|---|
| 5,381,062 | 1/1995 | Morris | 326/68 |
| 5,418,476 | 5/1995 | Strauss | 326/58 |
| 5,541,528 | 7/1996 | Montoye et al. | 326/34 |
| 5,587,671 | 12/1996 | Zagar et al. | 326/83 |
| 5,850,153 | 12/1998 | Harris et al. | 326/58 |
| 5,889,420 | 3/1999 | Poechmueller | 327/108 |

Primary Examiner—Michael Tokar
Assistant Examiner—Daniel D. Chang
Attorney, Agent, or Firm—Synnestvedt & Lechner

[57] ABSTRACT

In accordance with the present invention there is provided a tristatable digital MOS output buffer/driver having a significantly reduced subthreshold leakage current. The buffer of the present invention comprises three P-channel transistor devices and three N-channel transistor devices. A reduced subthreshold leakage current is achieved by having the source of the output N-channel transistor device and the output P-channel transistor device connected to nodes having a variable voltage. This adjusts the source-to-body voltages of the output N-channel and P-channel transistor devices to be equal in magnitude to the voltage of the positive supply, resulting in the reduction of subthreshold leakage currents.

44 Claims, 4 Drawing Sheets

6,107,829

LOW LEAKAGE TRISTATABLE MOS OUTPUT DRIVER

FIELD OF THE INVENTION

This invention relates generally to CMOS circuits designed to drive large capacitive loads with digital signals. In particular, the invention relates to tristatable MOS output buffers/drivers which have three possible output states: logic high, logic low, and high impedance.

BACKGROUND OF THE INVENTION

MOS output buffers are general purpose building blocks that are used extensively in electronic circuits. In digital CMOS circuits, output states are represented in binary form such that a logic 1 corresponds to a voltage equal to the positive supply and a logic 0 corresponds to a voltage equal to the negative supply. When a circuit node changes the logic state, the capacitance of this node must be charged to the new logic state in a reasonable amount of time. Often, a MOS output buffer is used to provide a sufficient charging current to the output node to change the logic level quickly.

It is often necessary to allow several circuit nodes to drive the same output node. In these situations, to avoid conflicts, when one circuit is driving a particular output node, all other circuits connected to this output node must be placed into a high impedance (tristate) mode. Hence tristatable MOS output buffers which have 3 possible output states: logic 1, logic 0 and high impedance are often used.

Due to the physical properties of MOS transistors, prior art MOS output buffers, when operating in the high impedance mode, have a certain subthreshold leakage current flowing into or out of them. This is undesirable because the MOS buffer's output also may serve as an input to various other circuit nodes which are sensitive to even low levels of leakage currents.

Thus, there exists a need for an output MOS buffer which has a reduced subthreshold leakage current over prior art buffers without degrading the buffer performance.

SUMMARY OF THE INVENTION

In accordance with the present invention there is provided a tristatable digital MOS output buffer/driver having a significantly reduced subthreshold leakage current.

Contrary to prior art, the inventive MOS output buffer, hereinafter "buffer", comprises three P-channel transistor devices, and three N-channel transistor devices. The buffer also has a control circuit, two input terminals, and one output terminal. The buffer is also connected to a positive supply and a negative supply.

The inventive buffer achieves a reduced subthreshold leakage current by having the sources of an output N-channel transistor device and an output P-channel transistor device connected to a node having a variable voltage. This helps to adjust the source-to-body voltage of the output N-channel and P-channel transistor devices. For a N-channel output transistor device, this adjusted source-to-body voltage is equal to the voltage of the positive supply. For a P-channel output transistor device, this adjusted source-to-body voltage is equal in magnitude but opposite in polarity to the voltage of the positive supply.

This adjusted source-to-body voltage of the output N-channel and P-channel transistors results in the reduction of subthreshold leakage current to zero or to a level substantially equal to zero.

BRIEF DESCRIPTION OF THE DRAWINGS

The invention is described in more detail hereinafter with reference to the accompanying drawings wherein like reference characters refer to the same parts throughout the several views and which.

DETAILED DESCRIPTION OF THE PREFERRED EMBODIMENT

Figure 1:
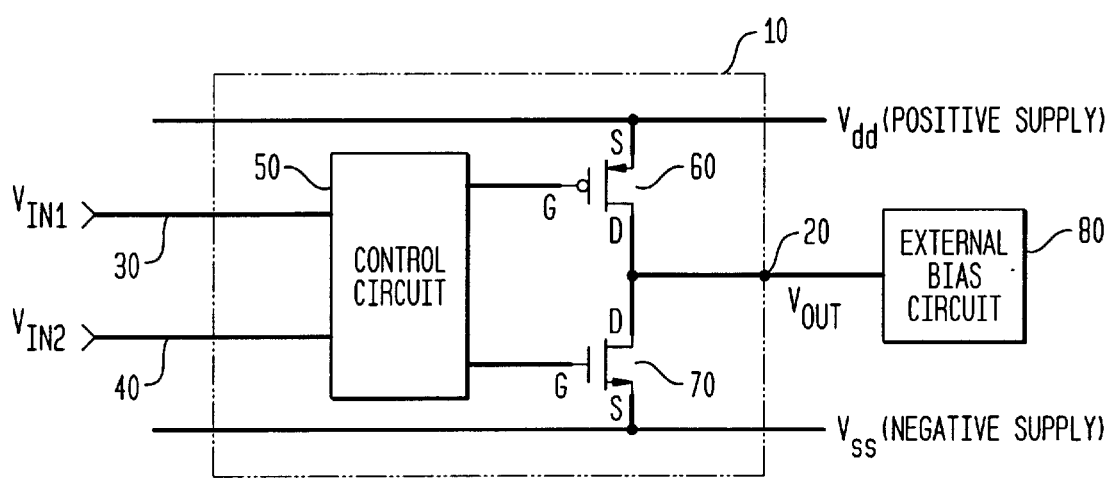
FIG. 1 illustrates a prior art tristatable buffer circuit.

FIG. 1 illustrates a prior art tristatable MOS output buffer/driver circuit 10, hereinafter "buffer 10". Buffer 10 comprises a control circuit 50, a P-channel transistor device 60, and an N-channel transistor device 70. Buffer 10 has one output terminal 20 and two input terminals 30 and 40. An external bias circuit 80 is connected at output terminal 20. Buffer 10 is also connected to positive supply $V_{dd}$ and negative supply $V_{ss}$.

When the gate-to-source voltage of each transistor device in buffer 10 is zero, the drain current of each transistor device is also zero, so theoretically no current should flow from the buffer 10 to external bias circuit 80 or from the external bias circuit 80 into the buffer 10. In actual functionality, however, a small amount of subthreshold leakage current does flow into and out of buffer 10 due to parasitic bipolar transistor action in the MOSFET.

The subthreshold leakage current ($I_{SUB}$) in the N-channel device 70 is given by $$I_{SUB}=I_s(e^{-(Vsb/Vt)}-e^{-(Vdb/Vt)}),$$

and the subthreshold leakage current ($I_{SUB}$) in the P-channel device 60 is given by $$I_{SUB}=I_s(e^{(Vsb/Vt)}-e^{(Vdb/Vt)}),$$

where $I_s$ is a current parameter that is proportional to the W/L (gate width divided by gate length) parameter of the transistor device, $V_{sb}$ is the source-to-body voltage of the transistor device, $V_{db}$ is the drain-to-body voltage of the transistor device and $V_t$ is the thermal voltage (kT/q; k=Boltzmann's constant, T=temperature in degrees K, q=charge on electron in coulombs). The thermal voltage $V_t$ is about 26 mV at room temperature. $V_t$ is usually very small compared to $V_{out}$. For a more detailed description of subthreshold leakage currents, see Microelectronic Devices, by Edward S. Yang, which is incorporated herein by reference.

As shown in FIG. 1, in most common CMOS manufacturing processes, the body terminal of the P-channel transistor device 60 is connected to the positive voltage supply $V_{dd}$, and the body terminal of the N-channel transistor device 70 is connected to the negative voltage supply $V_{ss}$.

When buffer 10 is operating in the high impedance mode, the external bias circuit 80 maintains the output voltage $V_{out}$ at a level somewhere between the negative voltage supply $V_{ss}$ and the positive voltage supply $V_{dd}$. The external bias circuit 80 is represented by having an ideal voltage source in series with a resistor (not shown).

When the buffer 10 is operating in the high impedance mode, the N-channel transistor device 70 has a source-to-body voltage ($V_{sb}$) which is equal to zero, and a drain-to-body voltage ($V_{db}$) which is equal to the output voltage $V_{out}$.

The subthreshold leakage current ($I_{SUB}$) in the N-channel transistor device 70 becomes $$I_{SUB}=I_s(e^{-0}-e^{-(Vout/Vt)}).$$

Since $V_{out} \gg V_T$, the subthreshold leakage current becomes $$I_{SUB}=I_s(e^{-0}-e^{(-\infty)}),$$

$$I_{SUB}=I_s(1-0),$$

$$I_{SUB}=I_s.$$

When the buffer 10 is operating in the high impedance mode, the P-channel transistor device 60 has source-to-body voltage $V_{sb}$=zero, and drain-to-body voltage $V_{db}$=$-(V_{dd}-V_{out})$. The subthreshold leakage current $I_{SUB}$ in the P-channel transistor device 60 is given by $$I_{SUB}=I_s(e^{(Vsb/Vt)}-e^{(Vdb/Vt)}),$$

$$I_{SUB}=I_s(e^{0}-e^{(-(Vdd-Vout)/Vt)}).$$

Since $V_{dd} \gg V_t$ and $(V_{dd}-V_{out}) \gg V_t$ $$I_{SUB}=I_s(1-e^{(-\infty)}),$$

$$I_{SUB}=I_s(1-0)=I_s.$$

Thus, the prior art buffer 10, when operating in the high impedance mode, carries a significant subthreshold leakage current $I_{SUB}$ which is equal to $I_s$. $I_s$ is proportional to the gate width divided by the gate length. In the prior art buffer 10, it is impossible to reduce $I_{SUB}$ to a level substantially equal to zero since it is impossible to make the gate width of the transistor equal to zero.

Figure 2:
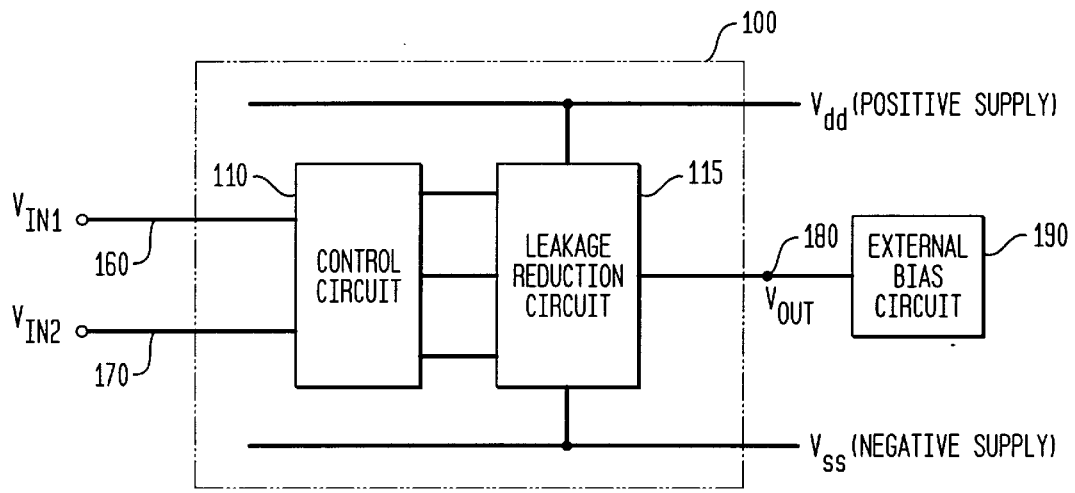
FIG. 2 is a block diagram of an MOS output buffer according to the present invention.
Figure 2A:
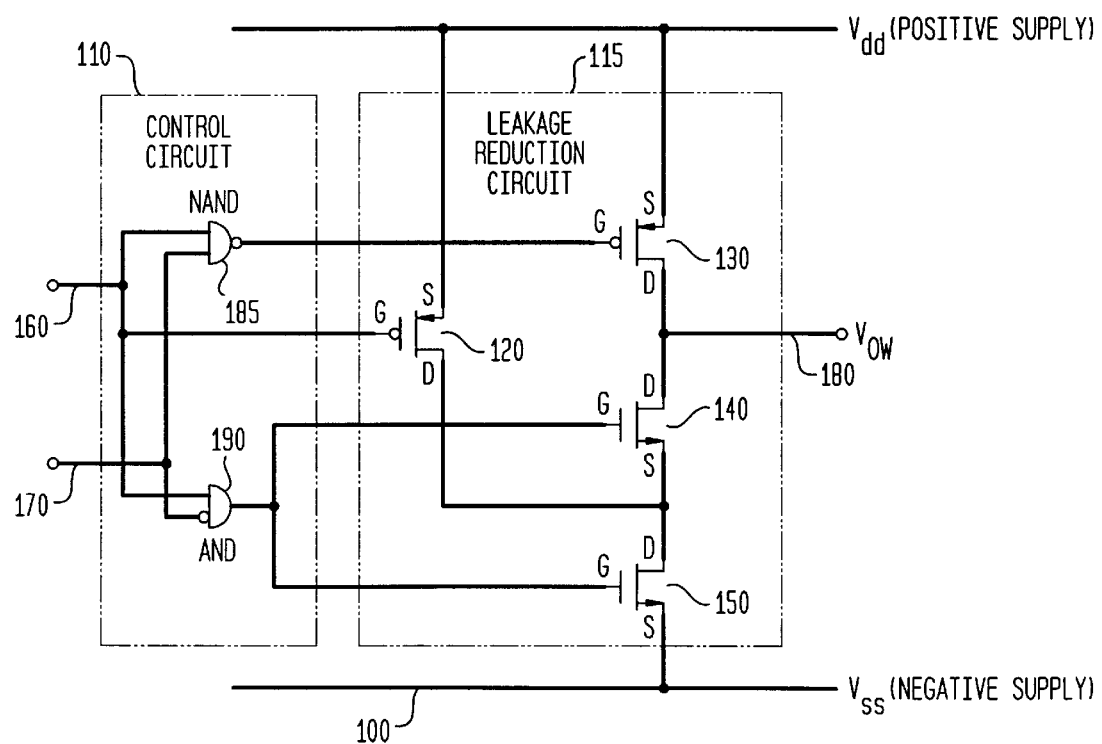
FIG. 2A is a circuit diagram of the MOS output buffer of FIG. 2.

FIGS. 2 & 2A depict a tristatable digital MOS output buffer/driver 100 according to the present invention which reduces subthreshold leakage current into and out of MOS output buffer to zero or to a level substantially equal to zero.

The inventive MOS output buffer/driver 100, hereinafter "buffer 100", comprises a control circuit 110 and a leakage reduction circuit 115. Buffer 100 also has two input terminals 160 and 170, and one output terminal 180. Buffer 100 is also connected to a positive supply $V_{dd}$ and to a negative supply $V_{ss}$.

An external bias circuit 190 is connected to buffer 100 at output terminal 180. The external bias circuit 190 is represented by having an ideal voltage source in series with a resistor (not shown). The external bias circuit 190 can maintain the output voltage $V_{out}$ at a level somewhere between the negative voltage supply $V_{ss}$ and the positive voltage supply $V_{dd}$.

The control circuit 110 is a conventional digital decoder circuit and is capable of decoding the input parameters, determining the output state, and then driving the gate voltages of N-channel and P-channel transistor devices to the appropriate levels to achieve the desired output state.

In this embodiment, the control circuit 110 comprises a NAND gate 185 and an AND gate 190. NAND gate 185 accepts inputs received at input terminals 160 and 170. AND gate 190 accepts input received at input terminal 160 and accepts the inverse of the input received at input terminal 170. The leakage reduction circuit 115 comprises a pair of P-channel transistor devices 120 and 130, and a pair of N-channel transistor devices 140 and 150.

The control circuit 110 is a decoder circuit which decodes the input parameters received at terminal 160 and 170, and then sets the gate voltages of the P-channel and N-channel transistor devices 120, 130, 140, 150 to appropriate levels to achieve the desired output state.

The buffer 100 achieves a reduced subthreshold leakage current by having the source of N-channel transistor device 140 directly connected to the drain of N-channel transistor device 150. This adjusts the source-to-body voltage of the N-channel device 140 to be equal to the voltage of the positive supply $V_{dd}$. This adjusted source-to-body voltage results in the reduction of the subthreshold leakage current to a level substantially equal to zero. In prior art devices, the source of the N-channel transistor device is connected to the negative supply resulting in subthreshold leakage current which cannot be made reduced to a level substantially equal to zero.

In the leakage reduction circuit 115, the drain of P-channel transistor device 130 is connected to the buffer's output terminal 180, the source of P-channel transistor device 130 is connected to the positive supply $V_{dd}$, and the gate of P-channel transistor device 130 is connected to the output of NAND gate 185.

The two N-channel transistor devices 140, 150 are connected as a pair such that the drain of the N-channel transistor device 140 is connected to the output terminal 180, and the source of the N-channel transistor device 140 is connected to the drain of the N-channel transistor device 150. The source of the N-channel transistor device 150 is connected to the negative supply $V_{ss}$. The gates of the two N-channel transistor devices 140 and 150 are connected to the output of AND gate 190.

The drain of P-channel transistor device 120 is connected to the common source-to-drain connection node of the N-channel transistor device pair 140 and 150, the source of the P-channel transistor device 120 is connected to the positive supply $V_{dd}$, and the gate of P-channel transistor device 120 is connected to control circuit 110.

Since the drains of N-channel transistor device 140 and P-channel transistor device 130 are directly connected to the output terminal 180, devices 130 and 140 are respectively referred to herein as P-channel and N-channel output transistors.

The control circuit 110 decodes the input parameters $V_{IN1}$ and $V_{IN2}$, determining the desired output state and then, based on the desired output state, sets the gate voltages of the P-channel and N-channel transistor devices 120, 130, 140, 150 to appropriate levels to achieve the desired output state of logic 1, logic 0, or high impedance. In a typical example, $V_{IN1}$ represents an ENABLE input and $V_{IN2}$ represents a DATA input. $V_{IN1}$ dictates whether buffer 100 should drive into a high-impedance output state. $V_{IN2}$ dictates whether buffer 100 should drive into a logic 0 or logic 1 output state. In this example, the output table for buffer 100 will look like:

| $V_{IN1}$ | $V_{IN2}$ | OutPut State |
|---|---|---|
| 0 | 0 | High-Impedance |
| 0 | 1 | High-Impedance |
| 1 | 0 | Logic 0 |
| 1 | 1 | Logic 1 |

Depending upon the input parameters of $V_{IN1}$ and $V_{IN2}$, the control circuit 110 configures the gate voltages of N-channel and P-channel transistor devices 140, 150, 120, 130 to a voltage equal to either of the positive supply $V_{dd}$ or negative supply $V_{ss}$.

To achieve a logic 1 output state, the gate voltages of the P-channel transistor device 130 and the N-channel transistor devices 140 and 150 are brought to a voltage equal to that of the negative supply $V_{ss}$. To achieve a logic 0 output state, the gate voltages of the P-channel transistor devices 120 and 130 and the N-channel transistor devices 140 and 150 are brought to a voltage equal to that of the positive supply $V_{dd}$. The high-impedance output state is achieved by bringing the gate of the P-channel transistor device 130 to a logic 1, the gates of the N-channel transistor devices 140 and 150 to a logic 0, and the gate of the P-channel transistor device 120 to a logic 0.

As previously described, when buffer 100 is operating in the high-impedance state, the subthreshold leakage current in N-channel output transistor 140 is given by $$I_{SUB}=I_s(e^{-(Vsb/Vt)}-e^{-(Vdb/Vt)},$$

where $I_s$ is a current parameter that is proportional to the W/L (gate width divided by gate length), $V_{sb}$ is the source to body voltage, $V_{db}$ is the drain to body voltage of the transistor and $V_t$ is the thermal voltage (kT/q.)

When buffer 100 is operating in the high-impedance mode, the output N-channel transistor device 140 has a source-to-body voltage $V_{sb}$ which is equal to positive supply $V_{dd}$ and is much greater than $V_t$. The drain-to-body voltage $V_{db}$ is equal to output voltage $V_{out}$. The subthreshold leakage current $I_{SUB}$ in output N-channel transistor device 140 becomes $$I_{SUB}=I_s(e^{-(Vdd/Vt)}-e^{-(Vout/Vt)}),$$

$$I_{SUB}=I_s(e^{-(\infty)}-e^{-(\infty)}),$$

$$I_{SUB}=I_s(0-0)=0.$$

Thus, the subthreshold leakage current in the output N-channel transistor device 140 is at zero level or at a level substantially equal to zero.

When buffer 100 is operating in the high-impedance mode, P-channel transistor device 130 has source-to-body voltage $V_{sb}$=zero and drain-to-body voltage $V_{db}$=−($V_{dd}$−$V_{out}$). The subthreshold leakage current $I_{SUB}$ in the output P-channel transistor device 130 is given by $$I_{SUB}=I_s(e^{(Vsb/Vt)}-e^{(Vdb/Vt)}),$$

$$I_{SUB}=I_s(e^{(0)}-e^{(-(Vdd/Vout)/Vt)}).$$

As $V_{dd}>>V_t$ and $(V_{dd}-V_{out})>>V_t$ $$I_{SUB}=I_s(1-e^{(-\infty)}),$$

$$I_{SUB}=I_s(1-0)=I_s.$$

making subthreshold leakage current in the P-channel output transistor 130 equal to $I_s$.

In most common CMOS manufacturing processes, the subthreshold leakage current $I_{SUB}$ for a P-channel transistor device is much less than the subthreshold leakage current for a N-channel transistor device. Thus, it becomes more important to reduce subthreshold leakage current into and out of the N-channel devices.

MOS output buffer 100 has a reduced subthreshold leakage current coming into and going out of the buffer as the subthreshold leakage current in the N-channel output transistor 140 is made equal to a zero level or a level substantially equal to zero. For example, if we have an application at a temperature of 100 degrees C with the following condition:

$V_{dd}$=3.0 V $V_{out}$=1.5V $V_t$=0.034V at 100 degrees C $I_s$=10 nA (for N-channel transistor device)

For prior art buffer 10, the subthreshold leakage current in the N-channel transistor device 70 becomes $$I_{SUB}=I_s(e^{-(Vsb/Vt)}-e^{-(Vdb/Vt)}),$$

$$I_{SUB}=I_s(e^{(0)}-e^{-(Vout/Vt)}),$$

$$I_{SUB}=I_s(1-e^{(-1.5/0.034)}),$$

$$I_{SUB}=I_s(1-6.9\times10^{-20}),$$

$$I_{SUB}=10 \text{ nA}=I_s$$

For the inventive buffer 100, the subthreshold leakage current in the N-channel transistor device becomes $$I_{SUB}=I_s(e^{-(Vsb/Vt)}-e^{-(Vdb/Vt)}),$$

$$I_{SUB}=I_s(e^{-(Vdd/Vt)}-e^{-(Vout/Vt)}),$$

$$I_{SUB}=I_s(e^{-(3.0/0.034)}-e^{-(1.5/0.034)}),$$

$$I_{SUB}=I_s(4.8\times10^{-39}-6.9\times10^{-20}),$$

$$I_{SUB}=-6.9\times10^{-20} \text{ nA}\sim0$$

Thus, the subthreshold leakage current $I_{SUB}$ has been reduced by twenty orders of magnitude over the prior art buffer subthreshold leakage current.

The present embodiment of the invention is particularly useful in applications where eliminating subthreshold leakage current in the N-channel transistor device is important. As described below, the present invention may be modified to eliminate subthreshold leakage current in the P-channel output transistor device or in both N-channel and P-channel output transistor devices.

Figure 3:
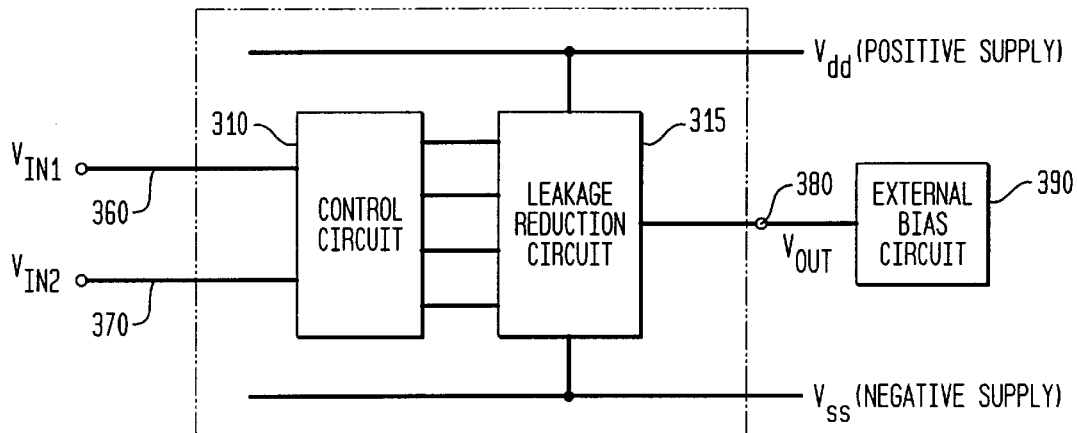
FIG. 3 is a block diagram of an alternative embodiment of an MOS output buffer according to the present invention.
Figure 3A:
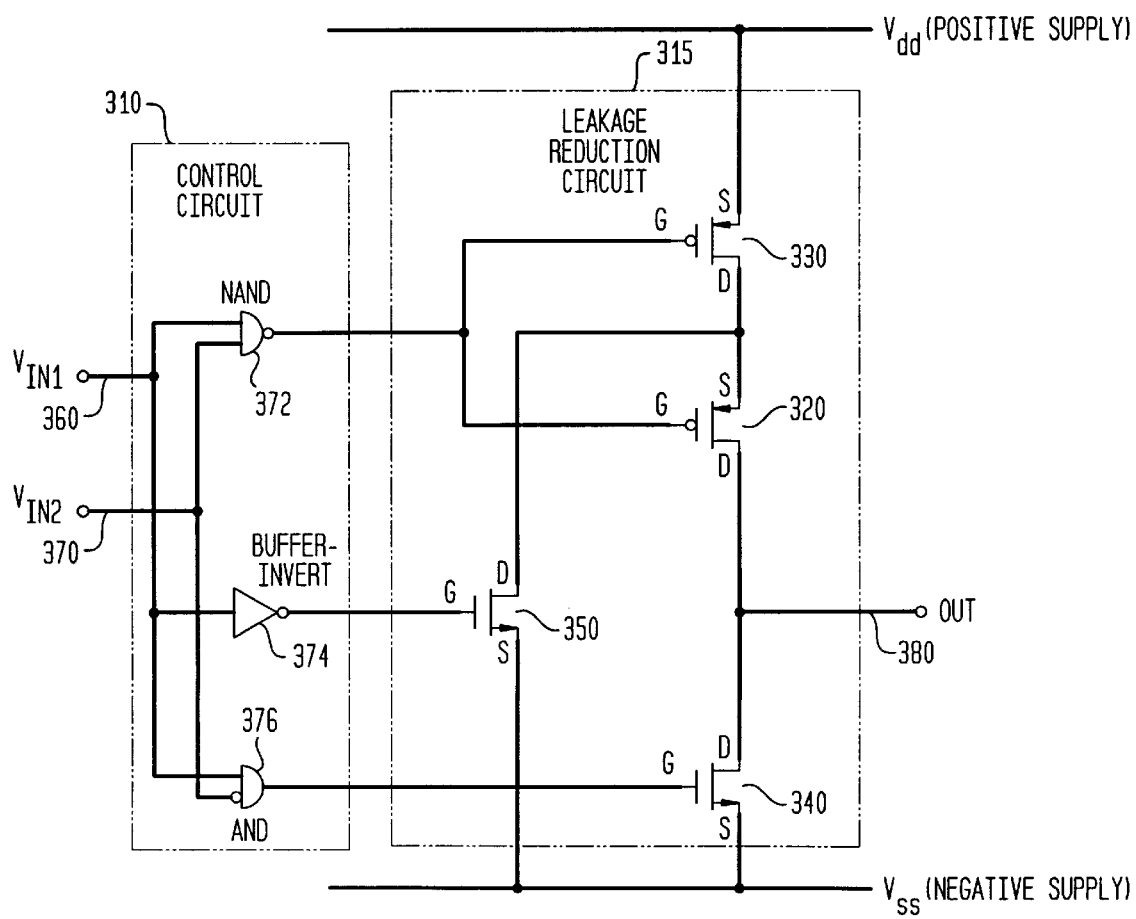
FIG. 3A is a circuit diagram of the MOS output buffer of FIG. 3.

FIGS. 3 & 3A depict an alternative embodiment of the current invention. This embodiment is particularly useful in applications requiring reduction of the subthreshold leakage current in P-channel transistor devices. The inventive MOS output buffer achieves a reduced subthreshold leakage current by connecting the source of the output P-channel transistor device to a node capable of having a variable voltage. Contrary to the prior art buffer in which the source-to-body voltage of the P-channel device is equal to zero, in this embodiment, the source-to-body voltage of the P-channel transistor device is equal to the −$V_{dd}$ (negative of the positive voltage supply). This directly results in the reduction of subthreshold leakage current in the P-channel transistor device.

MOS output buffer 300, hereinafter "buffer 300", comprises a control circuit 310, and a leakage reduction circuit 315. The buffer 300 also has two input terminals 360 and 370, and an output terminal 380. Buffer 300 is also connected to a positive voltage supply $V_{dd}$ and a negative voltage supply $V_{ss}$.

An external bias circuit 390 is connected to buffer 300 at the output terminal 380. The external bias circuit 390 is represented by an ideal voltage source in series with a resistor (not shown). The external bias circuit 190 can maintain the output voltage $V_{out}$ at a level somewhere between the negative voltage supply $V_{ss}$ and the positive voltage supply $V_{dd}$.

The control circuit comprises a NAND gate 372, an inverter 374 and an AND gate 376. NAND gate 372 accepts both inputs received at input terminals 360 and 370. Inverter 374 accepts input received at input terminal 360. AND gate 376 accepts the input received at input terminal 360 and the inverse of input received at input terminal 370. The leakage reduction circuit 315 comprises two N-channel transistor devices 340, 350, and a pair of P-channel transistor devices 320, 330.

The control circuit 310 is a conventional digital decoder circuit and is capable of decoding the input parameters, determining the output state, and then driving the gate voltages of N-channel and P-channel transistor devices to the appropriate levels to achieve the desired output state.

In leakage reduction circuit 315, the drain of N-channel transistor device 340 is connected to the output terminal 380 and the source of the N-channel transistor device 340 is connected to the negative voltage supply $V_{ss}$. The gate of the N-channel transistor device 340 is connected to the output of AND gate 376. The gate of N-channel transistor device 350 is connected to the output of inverter 374.

The pair of P-channel transistor devices 320 and 330 are connected such that the drain of the P-channel transistor device 320 is connected to the output terminal 380 and the source of the P-channel transistor device 320 is connected to the drain of the P-channel transistor device 330. The source of the P-channel transistor device 330 is connected to the positive supply $V_{dd}$. The gates of the two P-channel transistor devices 320 and 330 are connected to the output of NAND gate 372.

The drain of N-channel transistor device 350 is connected to the common source-to-drain connection node of the P-channel transistor device pair 320 and 330, the source of N-channel transistor device 350 is connected to the negative supply $V_{ss}$, and gate of N-channel transistor device 350 is connected to the output of the inverter 374.

As the drains of P-channel transistor device 320 and N-channel transistor device 340 are directly connected to the output terminal 380, they are respectively referred as P-channel and N-channel output transistor devices.

The control circuit 310 first decodes the two input voltages received at input terminals 360 and 370 and determines whether the output state should be equal to logic 1 state, logic 0 state, or a high impedance state. In this embodiment, the output table for buffer 300 looks like:

| $V_{IN1}$ | $V_{IN2}$ | OutPut State |
|---|---|---|
| 0 | 0 | High-Impedance |
| 0 | 1 | High-Impedance |
| 1 | 0 | Logic 0 |
| 1 | 1 | Logic 1 |

A logic 1 output state is achieved by bringing the gates of P-channel transistor devices 320 and 330 and the N-channel transistor devices 340 and 350 to a voltage equal to that of the negative supply $V_{ss}$. A logic 0 output state is achieved by bringing the gates of the P-channel transistor devices 320 and 330 and the N-channel transistor device 340 to a voltage equal to that of the positive supply $V_{dd}$. The high impedance output state is achieved by bringing the gates of the P-channel transistor devices 320 and 330 to a logic 1, the gate of the N-channel transistor device 340 to a logic 0, and the gate of the additional N-channel transistor device 350 to a logic 1.

In the high impedance state, output voltage ($V_{out}$) is determined by external bias circuitry 390. When buffer 300 is operating in the high impedance mode, the output N-channel transistor device 340 has a source-to-body voltage $V_{sb}$ equal to zero, and has drain-to-body voltage $V_{db}$ equal to output voltage $V_{out}$. The subthreshold leakage current $I_{SUB}$ in the N-channel output transistor 340 becomes $$I_{SUB}=I_s(e^{-(Vsb/Vt)}-e^{-(Vdb/Vt)})=I_s(e^{-(0)}-e^{-(Vout/Vt)}),$$

$$I_{SUB}=I_s(e^{-(0)}-e^{-(\infty)}),$$

$$I_{SUB}=I_s(1-0)=I_{SUB}.$$

The output P-channel transistor device 320 has a source-to-body voltage $V_{sb}=-V_{dd}$ and a drain-to-body voltage $V_{db}=-(V_{dd}-V_{out})$. The subthreshold leakage current $I_{SUB}$ in P-channel transistor device 320 is given by $$I_{SUB}=I_s(e^{(Vsb/Vt)}-e^{(Vdb/Vt)}),$$

$$I_{SUB}=I_s(e^{(-Vdd/Vt)}-e^{(-(Vdd-Vout)/Vt)}),$$

As $V_{dd}>>V_t$ and $V_{dd}-V_{out}>>V_t$ $$I_{SUB}=I_s(e^{(-\infty)}-e^{(-\infty)})$$

$$I_{SUB}=I_s(0-0)=0.$$

Thus the subthreshold leakage current in output P-channel transistor device 320 is at a zero level or at a level substantially equal to zero.

Therefore, MOS output buffer 300 reduces the subthreshold leakage current out of the buffer 300 by effectively bringing subthreshold leakage current in output P-channel transistor device 320 equal to a zero level or at a level substantially equal to zero.

For example, if we have a buffer application at a temperature of 100 degrees C with the following condition:

$V_{dd}$=3.0 V $V_{out}$=1.5V $V_t$=0.034V at 100 degrees C $I_s$=1 nA (for P-channel transistor device)

For prior art buffer 10, the subthreshold leakage current in the P-channel transistor device 60 becomes $$I_{SUB}=I_s(e^{(Vsb/Vt)}-e^{(Vdb/Vt)}),$$

$$I_{SUB}=I_s(e^{(0)}-e^{-((Vout-Vdd)/Vt)}),$$

$$I_{SUB}=I_s(1-e^{-(1.5/0.034)}),$$

$$I_{SUB}=I_s(1-6.9\times10^{-20}),$$

$$I_{SUB}=1 \text{ nA}=I_s$$

For the inventive buffer 300, the subthreshold leakage current in the P-channel transistor device becomes $$I_{SUB}=I_s(e^{(Vsb/Vt)}-e^{(Vdb/Vt)}),$$

$$I_{SUB}=I_s(e^{(-Vdd/Vt)}-e^{((Vout-Vdd)/Vt)}),$$

$$I_{SUB}=I_s(e^{-(3.0/0.034)}-e^{-(1.5/0.034)}),$$

$$I_{SUB}=I_s(4.8\times10^{-39}-6.9\times10^{-20}),$$

$$I_{SUB}=-6.9\times10^{-20} \text{ nA}\sim0$$

Thus, the subthreshold leakage current $I_{SUB}$ has been reduced by twenty orders of magnitude over the prior art buffer subthreshold leakage current.

Figure 4:
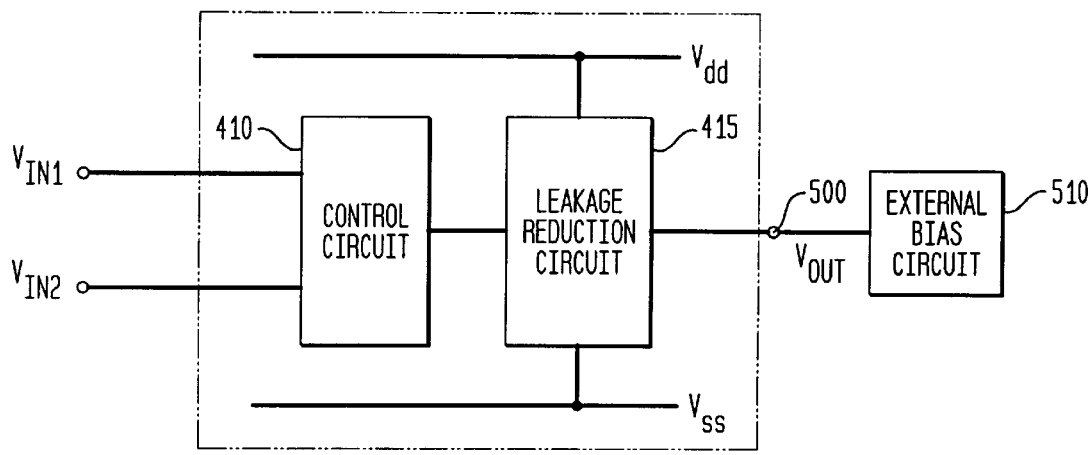
FIG. 4 is a block diagram of another alternative embodiment of an MOS output buffer according to the present invention.
Figure 4A:
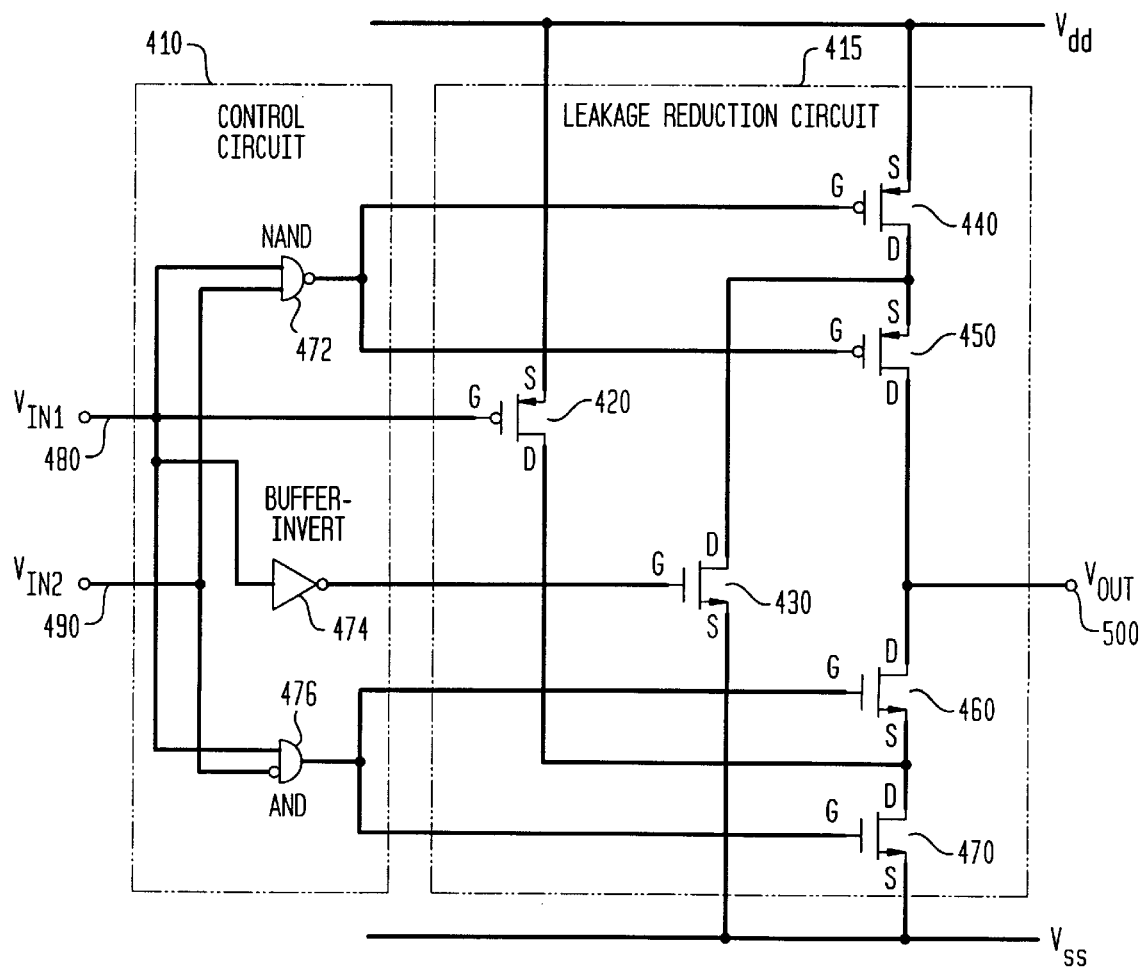
FIG. 4A is a circuit diagram of the MOS output buffer of FIG. 4.

FIGS. 4 & 4A depict an alternative embodiment of the current invention. This embodiment is particularly useful in applications requiring the reduction of subthreshold leakage current in P-channel as well as N-channel devices. In this embodiment, MOS output buffer 400, hereinafter "buffer 400" includes a control circuit 410, and a leakage control circuit 415. Buffer 400 is also connected to positive voltage supply $V_{dd}$ and negative voltage supply $V_{ss}$. Buffer 400 also has two input terminals 480, 490, and an output terminal 500.

An external bias circuit 510 is connected to buffer 400 at the output terminal 500. The external bias circuit 510 is represented by having an ideal voltage source in series with a resistor. The external bias circuit 510 can maintain the output voltage $V_{out}$ at a level somewhere between the negative voltage supply $V_{ss}$ and the positive voltage supply $V_{dd}$.

The control circuit 410 is a conventional digital decoder circuit and decodes the input parameters, and then, based on the desired output states, sets the gate voltages of N-channel and P-channel transistor devices to the appropriate levels to achieve the desired output state.

The control circuit 410 comprises a NAND gate 472, an inverter 474, and an AND gate 476. NAND gate 472 accepts both inputs received at input terminals 480 and 490. Inverter 474 accepts input received at input terminal 490. AND gate 476 accepts both inputs received at input terminals 480 and 490. The leakage control circuit 415 comprises a P-channel device transistor 420, an N-channel transistor device 430, a pair of N-channel transistor devices 460 and 470, and a pair of P-channel transistor devices 430 and 440.

In leakage control circuit 415, the pair of N-channel transistor devices 460 and 470 are connected such that the drain of the N-channel transistor device 460 is connected to the output terminal 500 and the source of the N-channel transistor device 460 is connected to the drain of the N-channel transistor device 470. The source of the N-channel transistor device 470 is connected to the negative voltage supply $V_{ss}$. The gates of the two N-channel transistor devices 460 and 470 are connected to the output of AND gate 476.

The P-channel transistor device 420 is located such that the drain of P-channel transistor device 420 is connected to the common source-drain connection node of the N-channel transistor pair 460 and 470, the source of P-channel transistor device 420 is connected to the positive voltage supply $V_{dd}$, and the gate of P-channel transistor device 420 is connected to input terminal 480.

The pair of P-channel transistor devices 440 and 450 are connected such that the drain of the P-channel transistor device 450 is connected to the output terminal 500 and the source of the P-channel transistor device 450 is connected to the drain of the P-channel transistor device 440. The source of the P-channel transistor device 440 is connected to the positive supply $V_{dd}$. The gates of the two P-channel transistor devices 450 and 440 are connected to the output of NAND gate 472.

The N-channel transistor device 430 is located such that the drain of N-channel transistor device 430 is connected to the common source-to-drain connection node of the P-channel transistor device pair 440 and 450, the source of N-channel transistor device 430 is connected to the negative voltage supply $V_{ss}$, and the gate of the N-channel transistor device 430 is connected to the output of inverter 474.

Since the drains of P-channel transistor device 450 and N-channel transistor device 460 are directly connected to output terminal 500, they are respectively referred as P-channel and N-channel output transistor devices.

The control circuit 410 decodes the two inputs received at input terminals 480 and 490 and then sets the output state either to a logic 1 output state, a logic 0 output state, or to a high impedance state.

In this embodiment, the output table for buffer 400 looks like:

| $V_{IN1}$ | $V_{IN2}$ | OutPut State |
|---|---|---|
| 0 | 0 | High-Impedance |
| 0 | 1 | High-Impedance |
| 1 | 0 | Logic 0 |
| 1 | 1 | Logic 1 |

A logic 1 output state is achieved by bringing the gates of the P-channel transistor devices 440 and 450, the N-channel transistor devices 460 and 470, and the N-channel transistor device 430 to a voltage equal to that of the negative supply $V_{ss}$. A logic 0 output state is achieved by bringing the gates of the P-channel transistor devices 440 and 450, the N-channel transistor devices 460 and 470, and the P-channel transistor device 420 to a voltage equal to that of the positive voltage supply $V_{dd}$. The output of the buffer 400 is put into the high-impedance state by bringing the gates of the P-channel transistor devices 440 and 450 to a logic 1, the gates of the N-channel transistor devices 460 and 470 to a logic 0, the gate of the P-channel transistor device 420 to a logic 0, and the gate of the N-channel transistor device 430 to a logic 1. In the high impedance state, output voltage $V_{out}$ is determined by external circuit 510 connected to the output terminal 500.

When buffer 400 is operating in the high impedance mode, the output N-channel transistor device 460 has a source-to-body voltage ($V_{sb}$) which is equal to positive supply $V_{dd}$ and is much greater than $V_t$. The subthreshold leakage current in output N-channel transistor device 460 becomes $$I_{SUB} = I_s(e^{-(Vdd/Vt)} - e^{-(Vout/Vt)}),$$

$$I_{SUB} = I_s(e^{-(\infty)} - e^{-(\infty)}),$$

$$I_{SUB} = I_s(0-0) = 0.$$

Thus, the subthreshold leakage current in output transistor device 460 is at a zero level or at level substantially close to zero.

When buffer 400 is operating in the high impedance mode, the output P-channel transistor device 450 has a source-to-body voltage $V_{sb} = -V_{dd}$, and $V_{db} = -(V_{dd} - V_{out})$, the subthreshold leakage current in the P-channel device 450 is given by $$I_{SUB} = I_s(e^{(Vsb/Vt)} - e^{(Vdb/Vt)}),$$

$$I_{SUB} = I_s(e^{(-Vdd/Vt)} - e^{(-(Vdd-Vout)/Vt)}).$$

As $V_{dd} \gg V_t$ and $V_{dd} - V_{out} \gg V_t$ $$I_{SUB} = I_s(e^{(-\infty)} - e^{(-\infty)})$$

$$I_{SUB} = I_s(0-0) = 0.$$

Thus the subthreshold leakage current in output P-channel transistor device 450 is at a zero level or at level substantially equal to zero.

Therefore, MOS output buffer 400 reduces the subthreshold leakage current in and out of buffer 400 by effectively bringing the subthreshold leakage current in the P-channel and N-channel output transistor devices equal or substantially equal to zero.

While there has been described herein the principles of the invention, it is to be understood by those skilled in the art that this description is made only by way of example and not as a limitation to the scope of the invention. For example, the inventive system and process may be used by any other technology which requires elimination of subthreshold or low leakage currents. Even though the inventor has provided some examples of the control circuit used in the invention, any other circuit which has same functional objectives may be used to practice the invention. Accordingly, it is intended by the appending claims, to cover all modifications of the invention which fall within the true spirit and scope of the invention.

What is claimed is:

1. A subthreshold leakage reduction circuit for a tristatable output buffer, said buffer having a control circuit, a positive supply voltage, and a negative supply voltage, said circuit comprising:
   a first output transistor device;
   a second output transistor device; and
   a first variable voltage source connected in series with said first output transistor device, wherein said first variable source adjusts the source-to-body voltage of said first output transistor to be equal to said positive supply voltage.

2. The circuit of claim 1, wherein said first variable voltage source comprises a N-channel transistor device.

3. The circuit of claim 1, wherein said first variable voltage source comprises a P-channel transistor device.

4. The circuit of claim 1, wherein said first variable source comprises a combination of P-channel and N-channel transistor devices.

5. The circuit of claim 1, further comprising a second variable voltage source connected in series with said second output transistor device.

6. The circuit of claim 5, wherein said second variable voltage source adjusts the source-to-body voltage of said second output transistor to be equal in magnitude but opposite in polarity to said positive supply voltage.

7. The circuit of claim 5, wherein said second variable voltage source comprises a N-channel transistor device.

8. The circuit of claim 5, wherein said second variable voltage source comprises a P-channel transistor device.

9. The circuit of claim 5, wherein said first output transistor is a N-channel transistor device and said second output transistor is a P-channel output transistor device.

10. A subthreshold leakage reduction circuit for a tristatable output buffer, said buffer having a control circuit, a positive supply voltage, and a negative supply voltage, said circuit comprising:
    a first output transistor device;
    a second output transistor device;
    a first variable voltage source connected in series with said first output transistor device; and
    a second variable voltage source connected in series with said second output transistor device;
    wherein said second variable voltage source comprises a combination of P-channel and N-channel transistor devices.

11. An integrated circuit having a subthreshold leakage reduction circuit for a tristatable output buffer, said buffer having a control circuit, a positive supply voltage, and a negative supply voltage, said circuit comprising:
    a first output transistor device;
    a second output transistor device; and
    a first variable voltage source connected in series with said first output transistor device, wherein said first variable source adjusts the source-to-body voltage of said first output transistor to be equal to said positive supply voltage.

12. The integrated circuit of claim 11, wherein said first variable voltage source comprises a N-channel transistor device.

13. The integrated circuit of claim 11, wherein said first variable voltage source comprises a P-channel transistor device.

14. The integrated circuit of claim 11, wherein said first variable source comprises a combination of P-channel and N-channel transistor devices.

15. The integrated circuit of claim 11, further comprising a second variable voltage source connected in series with said second output transistor device.

16. The integrated circuit of claim 15, wherein said second variable voltage source adjusts the source-to-body voltage of said second output transistor to be equal in magnitude but opposite in polarity to said positive supply voltage.

17. The integrated circuit of claim 15, wherein said second variable voltage source comprises a N-channel transistor device.

18. The integrated circuit of claim 15, wherein said second variable voltage source comprises a P-channel transistor device.

19. The integrated circuit of claim 15, wherein said first output transistor is a N-channel transistor device and said second output transistor is a P-channel output transistor device.

20. An integrated circuit having a subthreshold leakage reduction circuit for a tristatable output buffer, said buffer having a control circuit, a positive supply voltage, and a negative supply voltage, said circuit comprising:
    a first output transistor device;
    a second output transistor device;
    a first variable voltage source connected in series with said first output transistor device; and
    a second variable voltage source connected in series with said second output transistor device,
    wherein said second variable voltage source comprises a combination of P-channel and N-channel transistor devices.

21. A method of reducing the subthreshold leakage current in a tristatable output buffer having a control circuit, a first output transistor device, a second output transistor device, a positive supply voltage, and a negative supply voltage, said method comprising adjusting the source-to-body voltage of said first output transistor device to be equal to said positive supply voltage.

22. The method of claim 21, wherein said step of adjusting the source-to-body voltage of said first output transistor device comprises the step of connecting the source of said first output transistor device to a first variable voltage source.

23. The method of claim 22, wherein said first variable voltage source comprises a N-channel transistor device.

24. The method of claim 22, wherein said first variable voltage source comprises a P-channel transistor device.

25. The method of claim 22, wherein said first variable voltage source comprises a combination of N-channel and P-channel transistor devices.

26. The method of claim 21, further comprising the step of adjusting the source-to-body voltage of said second output transistor to be equal in magnitude but opposite in polarity to said positive supply voltage.

27. The method of claim 26, wherein said step of adjusting the source-to-body voltage of said second output transistor device comprises the step of connecting the source of said second output transistor device to a second variable voltage source.

28. The method of claim 27, wherein said second variable voltage source comprises a N-channel transistor device.

29. The method of claim 27, wherein said second variable voltage source comprises a P-channel transistor device.

30. The method of claim 27, wherein said first output transistor is a N-channel transistor device.

31. The method of claim 27, wherein said second output transistor is a P-channel transistor device.

32. A method of reducing the subthreshold leakage current in a tristatable output buffer having a control circuit, a first output transistor device, a second output transistor device, a positive supply voltage, and a negative supply voltage, said method comprising the steps of:

adjusting the source-to-body voltage of said first output transistor device to be equal to said positive supply voltage; and adjusting the source-to-body voltage of said second output transistor to be equal in magnitude but opposite in polarity to said positive supply voltage;

wherein said step of adjusting the source-to-body voltage of said second output transistor device comprises the step of connecting the source of said second output transistor device to a second variable voltage source, and wherein said second variable voltage source comprises a combination of N-channel and P-channel transistor devices.

33. A subthreshold leakage reduction circuit for a tristatable output buffer having a control circuit, a first output transistor device, a second output transistor device, a positive supply voltage, and a negative supply voltage, said circuit comprising means for adjusting the source-to-body voltage of said first output transistor device to be equal to said positive supply voltage.

34. The circuit of claim 33, wherein said means for adjusting the source-to-body voltage comprises a first variable voltage source connected to the source of said first output transistor device.

35. The circuit of claim 34, wherein said first variable voltage source comprises a N-channel transistor device.

36. The circuit of claim 34, wherein said first variable voltage source comprises a P-channel transistor device.

37. The circuit of claim 34, wherein said first variable voltage source comprises a combination of N-channel and P-channel transistor devices.

38. The circuit of claim 33, further comprising the means for adjusting the source-to-body voltage of said second output transistor to be equal in magnitude but opposite in polarity to said positive supply voltage.

39. The circuit of claim 38, wherein said means for adjusting the source-to-body voltage of said second output transistor device comprises a second variable voltage source connected to the source of said second output transistor device.

40. The circuit of claim 39, wherein said second variable voltage source comprises a N-channel transistor device.

41. The circuit of claim 39, wherein said second variable voltage source comprises a P-channel transistor device.

42. The circuit of claim 39, wherein said second variable voltage source comprises a combination of N-channel and P-channel transistor devices.

43. The circuit of claim 38, wherein said first output transistor is a N-channel transistor device.

44. The circuit of claim 38, wherein said second output transistor is a P-channel transistor device.

* * * * *